United States Patent [19]
Tomita

[11] Patent Number: 5,986,336
[45] Date of Patent: Nov. 16, 1999

[54] SEMICONDUCTOR DEVICE INCLUDING A HEAT RADIATION PLATE

[75] Inventor: Yoshihiro Tomita, Tokyo, Japan

[73] Assignee: Mitsubishi Denki Kabushiki Kaisha, Tokyo, Japan

[21] Appl. No.: 09/127,609

[22] Filed: Jul. 31, 1998

Related U.S. Application Data

[63] Continuation-in-part of application No. 08/910,348, Aug. 13, 1997, abandoned, which is a continuation of application No. 08/720,430, Sep. 30, 1996, abandoned.

[30] Foreign Application Priority Data

Mar. 22, 1996 [JP] Japan ................................. 8-66608

[51] Int. Cl.⁶ .................. H01L 23/495; H01L 23/34; H01L 23/04; H01L 23/28
[52] U.S. Cl. .................. 257/675; 257/712; 257/698; 257/796
[58] Field of Search .................. 257/675, 698, 257/706, 796

[56] References Cited

U.S. PATENT DOCUMENTS

| | | | |
|---|---|---|---|
| 5,139,969 | 8/1992 | Mori | 437/183 |
| 5,147,821 | 9/1992 | McShane et al. | 437/212 |
| 5,172,213 | 12/1992 | Zimmerman | 257/796 |
| 5,208,188 | 5/1993 | Newman | 437/220 |
| 5,314,842 | 5/1994 | Sawaya et al. | 437/211 |
| 5,334,872 | 8/1994 | Ueda et al. | 257/675 |
| 5,345,106 | 9/1994 | Doering et al. | 257/675 |
| 5,352,632 | 10/1994 | Sawaya | 437/209 |
| 5,378,924 | 1/1995 | Liang . | |
| 5,384,286 | 1/1995 | Hirai | 437/207 |
| 5,430,331 | 7/1995 | Hamzehdoost et al. . | |
| 5,440,169 | 8/1995 | Tomita et al. | 257/667 |
| 5,444,602 | 8/1995 | Banerjee et al. | 361/705 |
| 5,485,037 | 1/1996 | Marrs | 257/712 |
| 5,489,801 | 2/1996 | Blish, II . | |
| 5,508,232 | 4/1996 | Ueda et al. | 437/211 |
| 5,519,251 | 5/1996 | Sato et al. | 257/666 |
| 5,569,625 | 10/1996 | Yoneda et al. | 437/217 |
| 5,633,206 | 5/1997 | Kim et al. | 29/827 |

FOREIGN PATENT DOCUMENTS 6-151657  5/1994  Japan .

*Primary Examiner*—Teresa M. Arroyo
*Attorney, Agent, or Firm*—Leydig, Voit & Mayer, Ltd.

[57] ABSTRACT

A semiconductor device includes a semiconductor element, a mounting pad on which the semiconductor element is mounted; first internal leads electrically connected to the semiconductor element; a heat radiation plate spaced from and opposite the semiconductor element with the mounting pad and located between the heat radiation plate and the semiconductor element, the heat radiation plate having a second internal lead; a sealing material encapsulating the semiconductor element, the mounting pad, the first and second internal leads, and part of the heat radiation plate; external leads continuing from the first internal leads and extending outside of the sealing material; and a grounding lead continuous with and extending from the second internal lead of the heat radiation plate, outside of the sealing material, for mechanically mounting and electrically grounding the heat radiation plate.

3 Claims, 4 Drawing Sheets

SEMICONDUCTOR DEVICE INCLUDING A HEAT RADIATION PLATE

This disclosure is a continuation-in-part of U.S. patent application Ser. No. 08/910,348, filed Aug. 13, 1997 and abandoned which is a continuation of U.S. patent application Ser. No. 08/720,430, filed Sep. 30, 1996 and abandoned.

FIELD OF THE INVENTION

The present invention relates to a semiconductor device including a heat radiation plate arranged opposite and spaced from a die pad on which a semiconductor element is mounted, the die pad and heat radiation plate including external leads for mounting and grounding.

BACKGROUND OF THE INVENTION

FIG. 6 is a side sectional view of a conventional semiconductor device. In that semiconductor device, a semiconductor element 1 is secured to a die pad 2 with an adhesive 3. Electrode pads of the semiconductor element 1 and internal leads 5 are electrically connected to each other by wires 4. The semiconductor element 1, the die pad 2, the adhesive 3, the wires 4, and the internal leads 5 are encapsulated in a sealing material 6, such as an epoxy resin. The internal leads 5 extend outside of the sealing material as external leads 7.

The total thickness of the sealing material, D, includes the thickness $d_1$ of the semiconductor element 1 and the thickness $d_2$ of the sealing material adjacent the die pad 2.

In the conventional semiconductor device, it is desirable to decrease the total thickness D. However, when the total thickness is reduced, the thickness $d_2$ of the sealing material 6 is also reduced and the sealing material may not completely cover the die pad 2 so the quality of the encapsulated semiconductor device is poor.

It is also possible to decrease the thickness of the encapsulated semiconductor device by decreasing the thickness $d_1$ of the semiconductor element 1. However, when the thickness $d_1$ of the semiconductor element is decreased, the reliability of the semiconductor element declines.

Recent applications require semiconductor devices having good heat radiating characteristics. However, in the conventional semiconductor device shown in FIG. 6, good heat radiation characteristics cannot be obtained because the heat produced by the semiconductor element 1 is radiated through the sealing material 6. In order to improve the heat radiation characteristic, the entire reverse surface of the die pad 2 may be exposed, i.e., not covered by the sealing material, as illustrated in FIG. 7. In that structure, there is no sealing material under the die-pad 2, i.e., on the side of the die pad opposite the semiconductor element 1. Therefore, the total thickness D of the semiconductor device can be decreased by the thickness $d_2$ so that the semiconductor device is thinner. In addition, the heat produced by the semiconductor element 1 is radiated through the exposed surface of the die pad 2. Thus, a good heat radiation characteristic is obtained.

However, when the entire reverse surface of the die pad 2 is exposed, stress concentrates on an end surface 2a of the die pad 2 at an interface between the die pad 2 and the sealing material 6. Separation can occur at that interface due to the stress concentration so that the reliability of the semiconductor device declines.

SUMMARY OF THE INVENTION

The present invention is made to solve the described problems and its object is to provide a semiconductor device that is easily mounted, has good heat radiation characteristics, and is highly reliable.

In order to achieve these object, according to one aspect of the invention, there is provided a semiconductor device comprising a semiconductor element; a mounting pad on which the semiconductor element is mounted; first internal leads electrically connected to the semiconductor element; a heat radiation plate spaced from and opposite the semiconductor element, the mounting pad being located between the semiconductor element and the heat radiation plate, the heat radiation plate having a second internal lead; a sealing material encapsulating the semiconductor element, the mounting pad, the first and second internal leads, and part of the heat radiation plate; external leads continuous with the first internal leads and extending outside of the sealing material; and a grounding lead continuous with and extending from the second internal lead of the heat radiation plate, outside of the sealing material, for mechanically mounting and electrically grounding the heat radiation plate.

DETAILED DESCRIPTION OF THE PREFERRED EMBODIMENTS

First Embodiment

Figure 1:
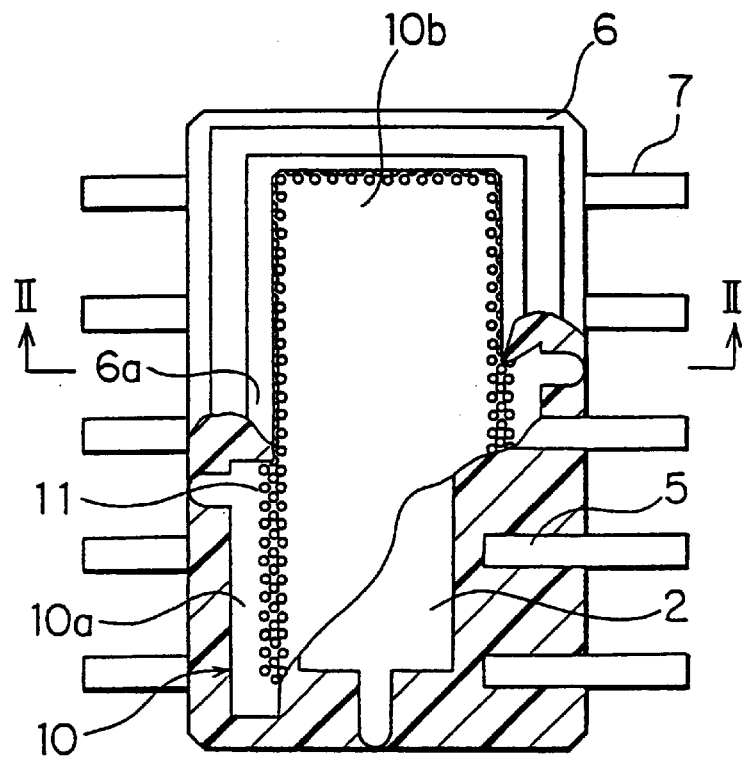
FIG. 1 is a partially broken away bottom view of a semiconductor device according to a first embodiment of the invention.
Figure 2:
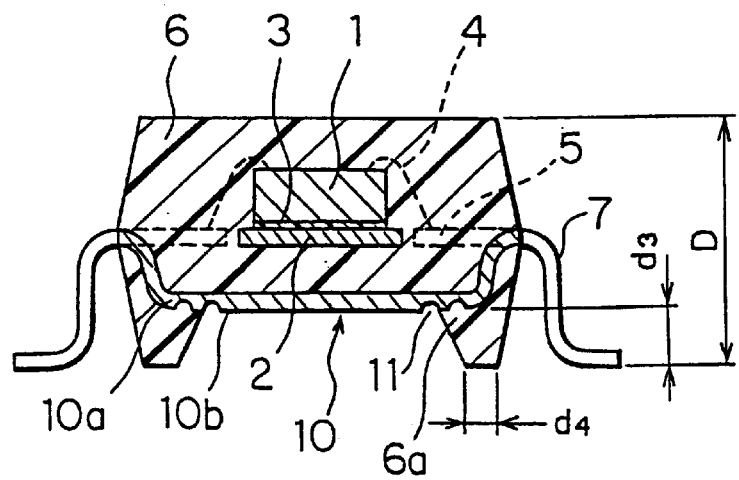
FIG. 2 is a sectional view of the semiconductor device shown in FIG. 1, taken along the line 2—2 of FIG. 1.
Figure 6:
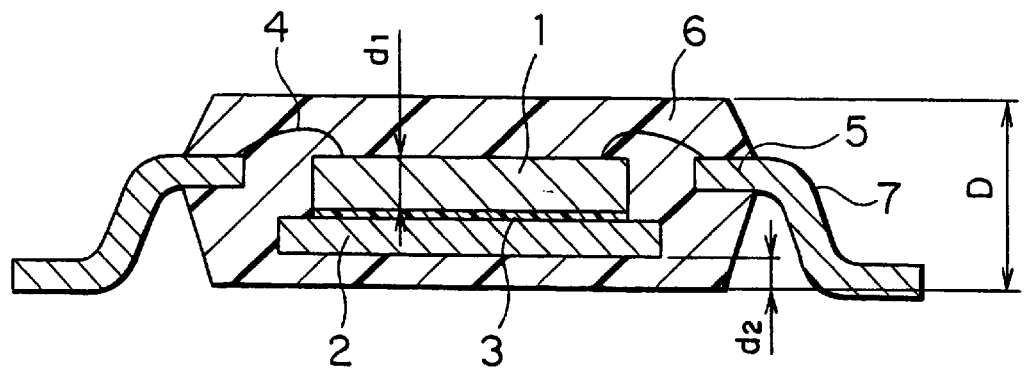
FIG. 6 is a sectional view of a conventional semiconductor device.
Figure 7:
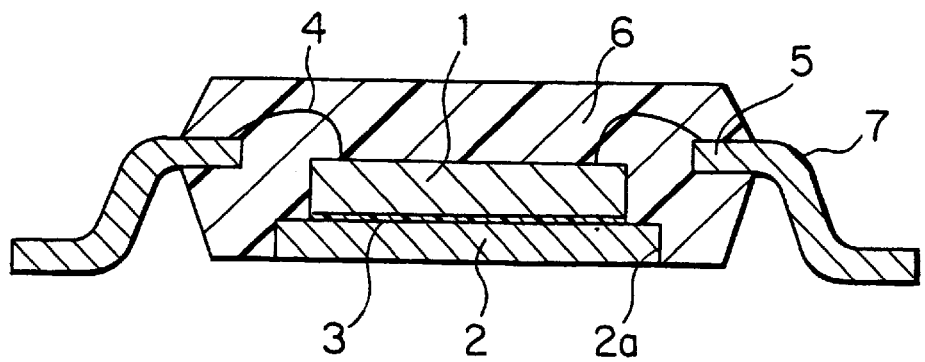
FIG. 7 is a perspective view of another conventional semiconductor device.

FIG. 1 is a partially broken away bottom view of a semiconductor device according to a first embodiment of the present invention and FIG. 2 is a sectional view of the semiconductor device of FIG. 1, taken along the line 2—2 of FIG. 1. In all figures, the same elements are given the same reference numerals. Elements already described with respect to FIGS. 6 and 7 are not described a second time.

In the semiconductor device of FIGS. 1 and 2, a semiconductor element 1 is secured to a die pat 2 with an adhesive 3. Electrode pads of the semiconductor element 1 are connected by wires 4 to respective internal leads 5. A heat radiation plate 10 is arranged opposite and spaced from the die pad 2. The semiconductor element 1, the die pad 2, the adhesive 3, the wires 4, the internal leads 5, and part of the heat radiation plate 10 are encapsulated in a sealing material 6. A region 10a of the heat radiation plate 10, adjacent the edge of the heat radiation plate, is encapsulated in a part of the sealing material 6 that has a frame shape. The central part of the reverse surface of the heat radiation plate 10 is not covered by the sealing material 6 but is an exposed surface 10b. Dimples 11 for preventing the flow of the sealing material 6 are located on the reverse surface of the heat radiation plate in a frame pattern. The flow preventing dimples are located in the region 10a of the rear surface of the heat radiation plate 10 that is covered by the portion 6a of the sealing material 6. The dimples extend into the exposed part of that surface.

In this embodiment, if the total thickness of the semiconductor device is reduced, and the thickness $d_3$ of the sealing material under the heat radiation plate 10 is reduced, the frame-shaped sealing material has a width $d_4$ at the region 10a of the rear surface of the heat radiation plate 10. Preferably, the thickness $d_3$ is no larger than 0.2 mm and is preferably less than 0.15 mm. Since, in the process of resin encapsulating a semiconductor device according to the first embodiment, it is not necessary to supply sealing material to all of the reverse surface of the heat radiation plate 10, the sealing quality is improved. The frame portion of the resin material includes the width $d_4$, at a minimum, to achieve sufficient bonding between the sealing material 6 and the heat radiation plate 10. When the width $d_4$ is reduced, the exposed area of the surface 10b is increased, improving heat radiation.

In the first embodiment, since the region 10a of the heat radiation plate 10 is covered with the sealing material, stress concentrations at the end of the plate 10 are reduced. Thus, separation at the interface between the sealing material 6 and the heat radiation plate 10 is prevented.

Since the dimples 11 are located in a frame-like arrangement on the reverse surface of the heat radiation plate 10, during resin encapsulation the sealing material 6 does not enter a gap between the heat radiation plate 10 and the a resin encapsulating mold because the sealing material flows into the dimples 11. An accurate configuration of the sealing material 6 is obtained and resin burrs that interfere with the heat radiation characteristic are absent from the reverse surface of the heat radiation plate 10. Therefore, superior heat radiation characteristics are achieved.

In the manufacturing process, the die pad is formed integrally with the internal leads 5 and the external leads 7 from a copper frame. If the die pad is made larger, the internal leads are shifted toward the outside by a distance equivalent to the increase of the size of the die pad 2. Then, the distance between the semiconductor element 1 mounted on the die pad 1 and the internal leads 5 is increased, increasing the length of the wires 4. The longer wires reduce wire bonding quality. There is a risk of breakage of the wires because they may be caught by another object in later processing, the yield is lowered, and the wires 4 must be handled particularly carefully. To solve these problems, the die pad 1 is prepared with a shape suitable for the external shape of the semiconductor element 1, limiting the size of the die pad 2.

Although the size of the die pad 2 is limited, the heat radiation plate is formed from a different; copper frame, free of the restrictions that apply to the die pad 2. Therefore, the heat radiation plate 10 can have a relatively large size, improving its heat radiation characteristics.

Second Embodiment

Figure 3:
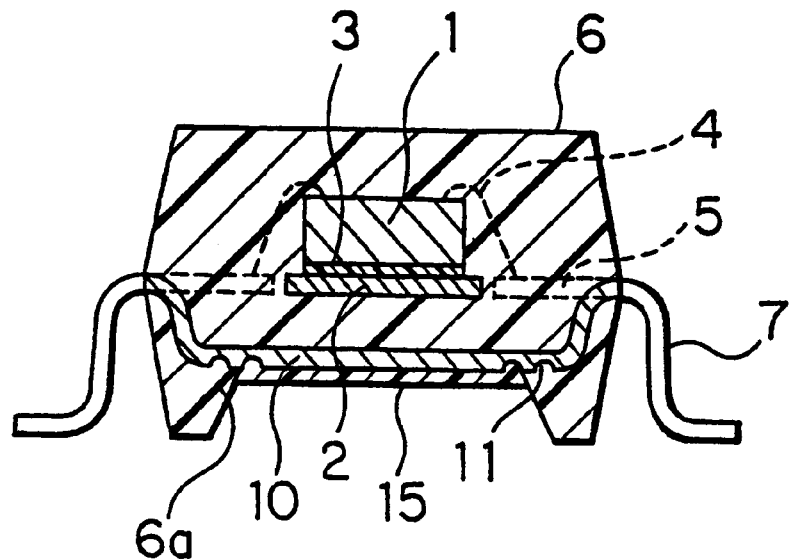
FIG. 3 is a sectional view showing a semiconductor device according to a second embodiment of the present invention.

FIG. 3 is a side sectional view showing a semiconductor device according to a second embodiment of the invention. In this embodiment, the heat radiation plate 10 is electrically connected with a ground (GND) electrode terminal of the semiconductor element 1. An insulating resin 15 covers the surface 10b of the heat radiation plate 10, which is no longer directly exposed. Otherwise, the structure of the second embodiment is the same as the structure of the first embodiment.

The insulating resin 15 can be applied to the surface 10b by potting, screen printing, or dipping. When the semiconductor device is mounted on a substrate, an exposed part of the heat radiation plate 10 may contact a power supply line or a signal line. However, in the second embodiment, because the insulating resin 15 covers the surface 10b of the heat radiation plate 10, electrical short-circuiting of the heat radiation plate 10 and current leakage are prevented, stabilizing the operation of the semiconductor element 1. Provided the insulating resin 15 is relatively thin, for example, an epoxy resin, good heat conductivity and radiation characteristics are achieved.

Figure 4:
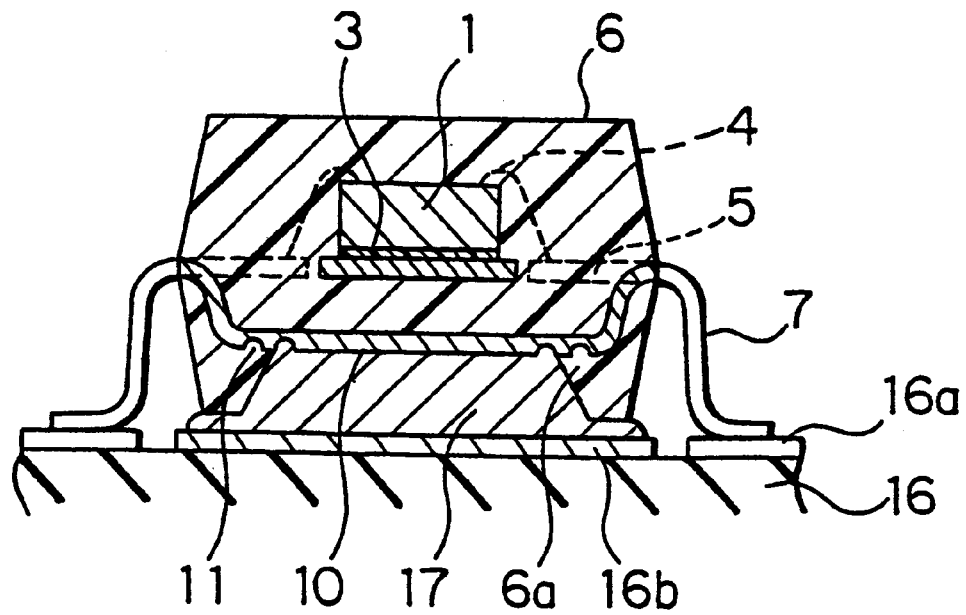
FIG. 4 is a sectional view showing a semiconductor device according to a third embodiment of the present invention.

Third Embodiment FIG. 4 is a side sectional view showing a third embodiment of the present invention. In this embodiment, the semiconductor device is mounted on a mounting substrate 16 and a conductive material 17 is interposed between the exposed surface 10b of the heat radiation plate 10 and a ground pattern 16b on the mounting substrate. The heat radiation plate 10 is connected to the die pad 2 or to the ground electrode terminal of the semiconductor element by a wire or similar connection. Otherwise, the structure of the third embodiment is the same as the structure of the first embodiment.

The conductive material 17 of the third embodiment may be, for example, solder with a low melting point. When the semiconductor device is mounted on the mounting substrate 16, the external leads 7 are attached to a wiring portion 16a of the mounting substrate 16 by a vapor phase surface mounting process or in an infrared reflow process. The heat radiation plate 10 is electrically connected to and mechanically secured to the ground pattern 16b of the mounting substrate by the conductive material 17 so that a ground potential is directed supplied to the semiconductor element 1 from the mounting substrate 16. The heat produced by the semiconductor element is conveyed to the mounting substrate 16 through the heat radiation plate 10 and the conductive material 17. Therefore, the heat radiation properties are improved.

In the third embodiment, when the semiconductor device is mounted on the mounting substrate 16, the exposed surface 10b of the heat radiation plate 10 is connected with the ground pattern 16b on the mounting substrate 16 through the conductive material 17. However, if it is unnecessary to ground the heat radiation plate 10, a heat conductive adhesive that is electrically insulating may be used instead of the electrically conductive material 17. In this case, the heat produced by the semiconductor element 1 is conveyed to the mounting substrate 16 from the heat radiation plate 10 through the heat conductive adhesive, thereby providing a good heat radiation characteristic.

Fourth Embodiment

Figure 5:
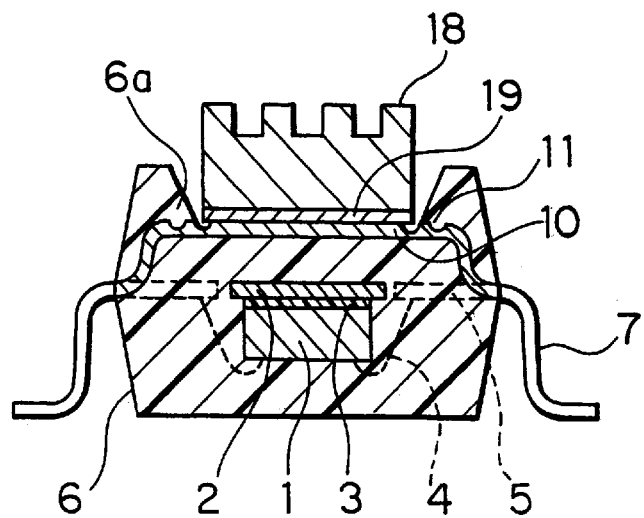
FIG. 5 is a sectional view showing a semiconductor device according to a fourth embodiment of the present invention.

FIG. 5 is a side sectional view of a semiconductor device according to a fourth embodiment of the present invention. In this fourth embodiment, the external leads 7 are bent in the opposite direction from the second and third embodiments, so that the exposed surface 10b of the heat radiation plate 10 is oriented in a direction opposite to a substrate on which the semiconductor device is mounted. Heat radiation fins 18 are secured to the exposed surface 10b with an adhesive 10, improving the heat radiation characteristics. The remaining structure of the fourth embodiment is the same as that of the first embodiment.

In a fourth embodiment, an insulating material may be used as the adhesive 19 so that the same electrical insulating property as in the second embodiment, electrically isolating the heat radiation plates 10, may be achieved. Alternatively, the heat radiation plate 10 and the heat radiation fins 18 may be an integral unit, providing for both electrical and thermal conduction.

Fifth Embodiment

In the first embodiment, the dimples 11 are arranged in a frame shape on the reverse surface of the heat radiation plate 10 in the region 10a and in part of the exposed surface 10b. In the fifth embodiment, the dimples 11 are located on the entire reverse surface of the heat radiation plate 10. In this instance, the sealing material 6 is prevented from flowing onto the exposed surface 10a during resin sealing. Therefore, the exposed area of the heat radiation plate 10 is increased, improving the heat radiation characteristics. This modification, providing dimples 11 on the entire rear surface of the heat radiation plate 10 can be applied to the second through fourth embodiments with the same improvement in heat radiation characteristics.

Sixth Embodiment

Figure 8:
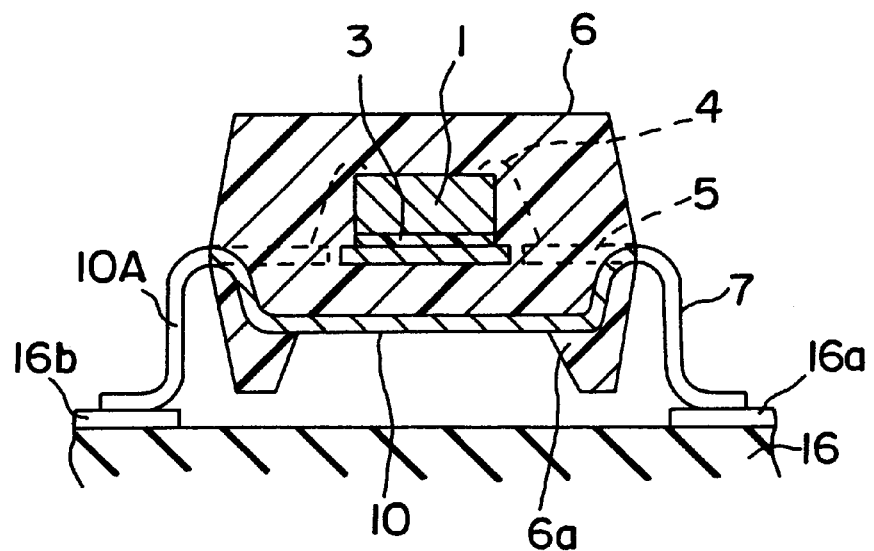
FIG. 8 is a sectional view showing a semiconductor device according to a sixth embodiment of the present invention.

FIG. 8 is a side sectional view of a semiconductor device according to a sixth embodiment of the invention. The sixth embodiment of the invention is similar to the second embodiment except in three important respects. First, no dimples 11 are present on the heat radiation plate 10, although dimples could be present. Second, no insulating layer 15 covers the exposed surface 10b of the heat radiation plate 10. Such an electrically insulating layer can be added to the sixth embodiment, if desired, to avoid short circuiting or electrical connection of the heat radiation plate to a signal line. Third, the heat radiation plate 10 includes an unnumbered internal lead and an external lead 10A that is continuous with the internal lead. The external lead 10A is not encapsulated by the sealing material 6 and protrudes from the sealing material 6.

As shown in FIG. 8, the external lead 10A resembles the external lead 7 that is electrically connected to the semiconductor element 1 through the internal lead 5 and wire 4. Both external leads 7 and 10A are present in the sixth embodiment and, in the side view of FIG. 8, closely resemble each other. However, the external leads 7 are electrically connected to the semiconductor element 1 and the external lead 10A is electrically connected to the heat radiation plate 10. Depending upon electrical connections within the sealing material 6 or of the external leads to other elements, the external leads 7 and 10A may be electrically isolated from each other or electrically coupled to each other.

In the sixth embodiment, the external lead 10A of the heat radiation plate 10 is mechanically and electrically connected to a ground pattern 16b on a mounting substrate 16, for example, by solder. This arrangement ensures a ground connection to the heat radiation plate 10, as in the third embodiment, but without the necessity of providing the electrically conductive material 17 between the ground pattern 16b and the heat radiation plate 10.

Seventh Embodiment

Figure 9:
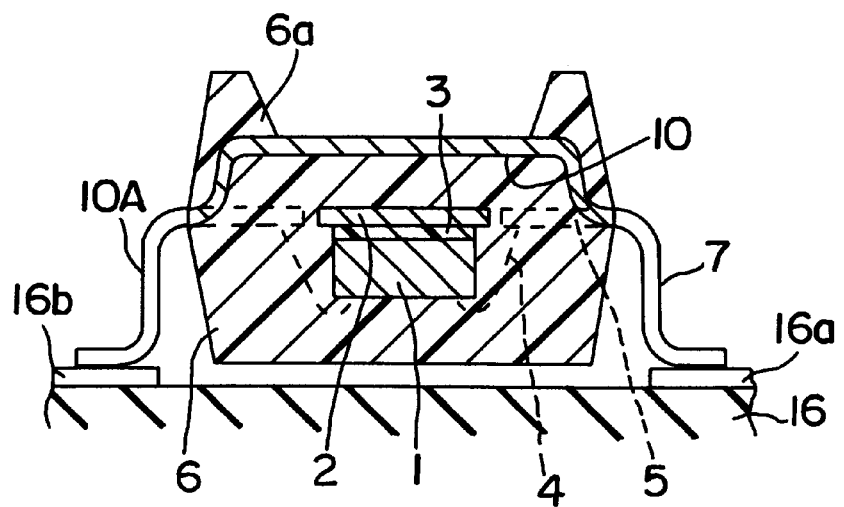
FIG. 9 is a sectional view showing a semiconductor device according to a seventh embodiment of the present invention.

FIG. 9 is a sectional side view of a semiconductor device according to a seventh embodiment of the invention. The seventh embodiment is essentially identical to the sixth embodiment except that the external lead 7 electrically connected to the semiconductor element 1 is bent in a direction, with respect to the die pad 2, opposite the bending direction of the sixth embodiment. The different bending direction of the external lead 7 is similar to the arrangement illustrated in FIG. 5 with respect to the fourth embodiment. Likewise, the external lead 10A of the heat radiation plate 10 is bent in an opposite direction from the bending direction depicted in FIG. 8.

In the seventh embodiment, the semiconductor device can be mounted on the substrate 16 with the external leads 7 and 10A respectively mounted to signal and grounding patterns 16a and 16b on the mounting substrate 16, with the exposed surface 10b of the heat radiation plate oriented away from the substrate 16. As in the fourth embodiment, this orientation permits the addition of heat radiation fins 18, not shown in FIG. 9, in thermal contact with the heat radiation plate 10 to improve the heat radiation characteristics.

I claim:

1. A semiconductor device comprising:

a semiconductor element;

a mounting pad on which the semiconductor element is mounted;

first internal leads electrically connected to the semiconductor element;

a heat radiation plate spaced from and opposite the semiconductor element, the mounting pad being located between the semiconductor element and the heat radiation plate, the heat radiation plate having a second internal lead;

a sealing material encapsulating the semiconductor element, the mounting pad, the first and second internal leads, and part of the heat radiation plate;

external leads continuous with the first internal leads and extending outside of the sealing material; and a grounding lead continuous with and extending from the second internal lead of the heat radiation plate, outside of the sealing material, for mechanically mounting the semiconductor device and electrically grounding the heat radiation plate.

2. The semiconductor device according to claim 1 comprising a mounting substrate having a ground pattern and a signal pattern wherein the grounding lead is electrically connected to the ground pattern and the external leads are connected to the signal pattern.

3. The semiconductor device according to claim 1 wherein a part of a surface of the heat radiation plate is exposed and not covered by the sealing material.

* * * * *